United States Patent
Osmanovic (10) Patent No.: US 11,153,043 B2
(45) Date of Patent: Oct. 19, 2021

(54) MEASURING AND EVALUATING A TEST SIGNAL GENERATED BY A DEVICE UNDER TEST (DUT)

(71) Applicant: Roku, Inc., Los Gatos, CA (US)

(72) Inventor: Nermin Osmanovic, Austin, TX (US)

(73) Assignee: Roku, Inc., San Jose, CA (US)

( * ) Notice: Subject to any disclaimer, the term of this patent is extended or adjusted under 35 U.S.C. 154(b) by 0 days.

(21) Appl. No.: 16/662,785

(22) Filed: Oct. 24, 2019

(65) Prior Publication Data
US 2021/0126748 A1 Apr. 29, 2021

(51) Int. Cl.
| | | |
|---|---|---|
| *H04L 1/24* | (2006.01) | |
| *G01R 31/28* | (2006.01) | |
| *H04L 1/06* | (2006.01) | |
| *H04R 29/00* | (2006.01) | |
| *G01R 31/3193* | (2006.01) | |

(52) U.S. Cl.
CPC .......... *H04L 1/242* (2013.01); *G01R 31/2879* (2013.01); *H04L 1/06* (2013.01); *H04R 29/001* (2013.01); *G01R 31/31937* (2013.01); *H04R 29/008* (2013.01)

(58) Field of Classification Search
CPC .... H04R 29/001; H04R 29/008; H04R 25/30; H04R 25/305; H04L 1/242; H04L 1/06; G01R 31/2879; G01R 31/31937
See application file for complete search history.

(56) References Cited

U.S. PATENT DOCUMENTS

| | | | | |
|---|---|---|---|---|
| 8,731,206 B1* | 5/2014 | Park | ..................... | H04R 29/001 381/59 |
| 2007/0112563 A1* | 5/2007 | Krantz | ..................... | G10L 25/69 704/216 |
| 2009/0304195 A1* | 12/2009 | Fillol | ..................... | H04R 29/007 381/59 |

(Continued)

FOREIGN PATENT DOCUMENTS

| | | |
|---|---|---|
| JP | H09325791 A | 12/1997 |
| JP | 2017175583 A | 9/2017 |
| KR | 20120059973 A | 6/2012 |

OTHER PUBLICATIONS

International Search Report and Written Opinion of the International Searching Authority directed to related International Patent Application No. PCT/US2020/057076, dated Feb. 15, 2021, 9 pages.

*Primary Examiner* — Jason R Kurr
(74) *Attorney, Agent, or Firm* — Sterne, Kessler, Goldstein & Fox P.L.L.C.

(57) ABSTRACT

Embodiments described herein generally relate to measuring and evaluating a test signal generated by a device under test (DUT). In particular, the test signal generated by the DUT may be compared to a reference signal and scored based on the comparison. For example, a method may include: capturing a test signal from a device under test; splicing the test signal into a plurality of test audio files based on a plurality of frequency bins; at each frequency bin, comparing each of the plurality of test audio files to a corresponding reference audio file from among a plurality of reference audio files, the plurality of reference audio files being associated with a reference signal; and calculating a performance score of the device under test based on the comparisons.

20 Claims, 10 Drawing Sheets

(56) References Cited

U.S. PATENT DOCUMENTS

| | | | |
|---|---|---|---|
| 2011/0015898 A1* | 1/2011 | Klippel | H04R 29/001 |
| | | | 702/185 |
| 2011/0299691 A1* | 12/2011 | Yoshino | H04R 29/00 |
| | | | 381/59 |
| 2013/0129097 A1 | 5/2013 | Park et al. | |
| 2013/0343552 A1* | 12/2013 | Xiao | G01H 3/06 |
| | | | 381/58 |
| 2020/0107144 A1* | 4/2020 | Miyamoto | H04R 29/00 |

* cited by examiner

MEASURING AND EVALUATING A TEST SIGNAL GENERATED BY A DEVICE UNDER TEST (DUT)

TECHNICAL FIELD

Embodiments included herein generally relate to measuring and evaluating a test signal generated by a device under test (DUT). In particular, the test signal generated by the DUT may be compared to a reference signal and scored based on the comparison.

BACKGROUND

An ideal acoustic signal may be represented by a sinusoidal wave having a smooth curve in the time domain and have a single peak at the fundamental frequency in the spectral domain. However, in practical settings, acoustic signals output by speakers frequently are imperfect sinusoidal waves with jagged, bent, and unexpected waveforms in the time domain and multiple peaks (i.e., overtones) at frequencies other than the fundamental frequency. Testing these speakers to gauge their quality often requires a human listener to vet the quality of the speaker, and as such, the quality of the speaker may not be quantifiable.

BRIEF DESCRIPTION OF THE DRAWINGS

The accompanying drawings are incorporated herein and form a part of the specification.

In the drawings, like reference numbers generally indicate identical or similar elements. Additionally, generally, the left-most digit(s) of a reference number identifies the drawing in which the reference number first appears.

SUMMARY

Provided herein are system, apparatus, article of manufacture, method and/or computer program product embodiments, and/or combinations and sub-combinations thereof, for measuring and evaluating a signal generated by a device under test (DUT).

In some embodiments, the present disclosure is directed to a method for measuring and evaluating a signal generated by a device under test (DUT). The method may include: capturing a test signal from a device under test; splicing the test signal into a plurality of test audio files based on a plurality of frequency bins; at each frequency bin, comparing each of the plurality of test audio files to a corresponding reference audio file from among a plurality of reference audio files, the plurality of reference audio files being associated with a reference signal; and calculating a performance score of the device under test based on the comparisons.

In some embodiments, the present disclosure is directed to a non-transitory, tangible computer-readable device having instructions stored thereon that, when executed by at least one computing device, causes the at least one computing device to perform operations. The operations may include: capturing a test signal from a device under test; splicing the test signal into a plurality of test audio files based on a plurality of frequency bins; at each frequency bin, comparing each of the plurality of test audio files to a corresponding reference audio file from among a plurality of reference audio files, the plurality of reference audio files being associated with a reference signal; and calculating a performance score of the device under test based on the comparisons.

In some embodiments, the present disclosure is directed to a device. The device may include a memory storing instructions for measuring and evaluating a signal generated by a device under test (DUT) and a processor configured to execute the instructions. The instructions may cause the processor to perform operations including: capturing a test signal from the DUT; slicing the test signal into a plurality of test audio files based on a plurality of frequency bins; at each frequency bin, comparing each of the plurality of test audio files to a corresponding reference audio file from among a plurality of reference audio files, the plurality of reference audio files being associated with a reference signal; and calculating a performance score of the device under test based on the comparisons.

Further features and advantages of the embodiments disclosed herein, as well as the structure and operation of various embodiments, are described in details below with reference to the accompanying drawings. It is noted that this disclosure is not limited to the specific embodiments described herein. Such embodiments are presented herein for illustrative purposes only. Additional embodiments will be apparent to a person skilled in the relevant art based on the teachings contained herein.

DETAILED DESCRIPTION OF THE INVENTION

Provided herein are system, method, computer program product and/or device embodiments, and/or combinations thereof, to measuring and evaluating a signal generated by a device under test (DUT).

In some embodiments, a system may be configured to capture an acoustic signal generated by a reference speaker calibrated at a first power output level and store the acoustic signal generated at the first power output level as a first reference signal. Similarly, the system may be configured to capture an acoustic signal generated by the reference speaker calibrated at a second power output level and store the acoustic signal generated at the second power output level as a second reference signal. The system may also be configured to capture a first test signal and a second test signal from a device under test at each respective power output level, process the first and second test signals to extract individual frequency bins for each signal, and compare the first and second test signals to a respective one of the first and second reference signals. For each comparison, the system may be configured to generate a report indicating a performance grade of the device under test. For example, the report may include a graphical illustration of the performance grade of the device under test. The performance grade may be derived from a sinusoidal, frequency based step sweep comparison of the test signals to the reference signals at each power output level.

Figure 1:
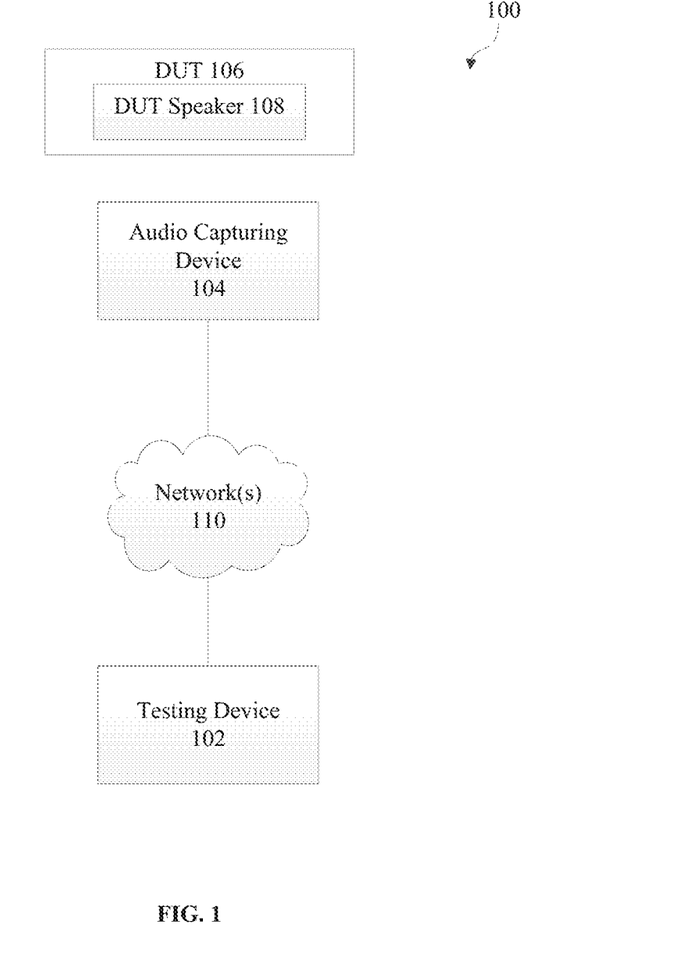
FIG. 1 illustrates a testing environment, according to some embodiments.
Figure 4:
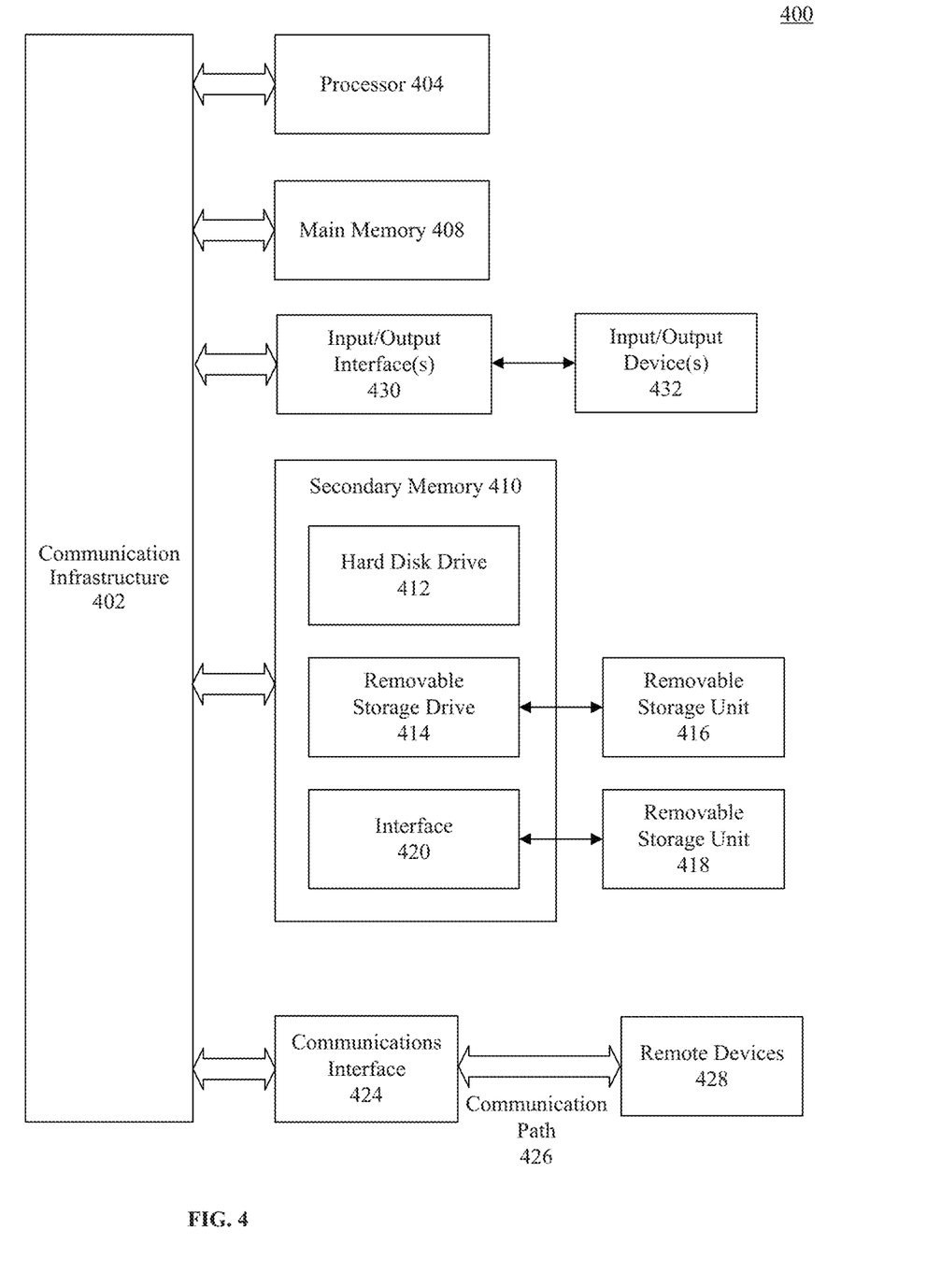
FIG. 4 illustrates an example computer system useful for implementing various embodiments.

FIG. 1 illustrates a testing environment for measuring and evaluating a signal generated by a device under test (DUT). Referring to FIG. 1, the testing environment 100 may include a testing device 102, an audio capturing device 104, and a DUT 106 having one or more DUT speakers 108. The testing device 102 and the audio capturing device 104 may be coupled to each other using either a wired connection or a wireless connection, as should be understood by those of ordinary skill in the art. For example, the testing device 102 and the audio capturing device 104 may communicate via a communication network(s) 110. The communication network 110 may include any or all of a wired and/or wireless private network, personal area network (PAN), Local-Area Network (LAN), a Wide-Area Network (WAN), or the Internet. The audio capturing device 104 may any well-known audio capturing device, such as, but not limited to, a microphone, a vibrometer, a laser, or the like. The testing device 102 may be a computing device, such as the computer system 400 illustrated in FIG. 4 discussed in greater detail below. In some embodiments, the processes described herein performed by the testing device 102 may be performed using a processor, e.g., a processor 404 as shown in FIG. 4.

The DUT 106 may be, without limitation, a media player, television, a wireless device, a smartphone, a tablet computer, a laptop/mobile computer, a handheld computer, a server computer, an in-appliance device, Internet of Things (IoT) device, streaming media player, a game console, and/or an audio/video receiver. In some embodiments, the speakers 108 may be different types of audio devices. For example, the speakers 108 may be, without limitation, a combination of one or more different types of speakers, such as full-range drivers, subwoofers, woofers, mid-range drivers, tweeters, sound bars, and/or coaxial drivers, to name just some examples. It should be understood by those of ordinary skill in the arts that each of the speakers 108 may be designed to produce sound at different frequencies. For example, a tweeter may be designed to produce sound at high audio frequencies, e.g., 2,000 Hz to 20,000 Hz, whereas subwoofers and woofers may be designed to produce sound at low audio frequencies, e.g., 40 Hz up to 500 Hz. As such, each speaker 108 may be designed to produce different features of an audio signal, e.g., tweeters may be designed to produce more treble, whereas woofers and sub-woofers may be designed to produce more bass and sub-bass, respectively.

Figure 5A:
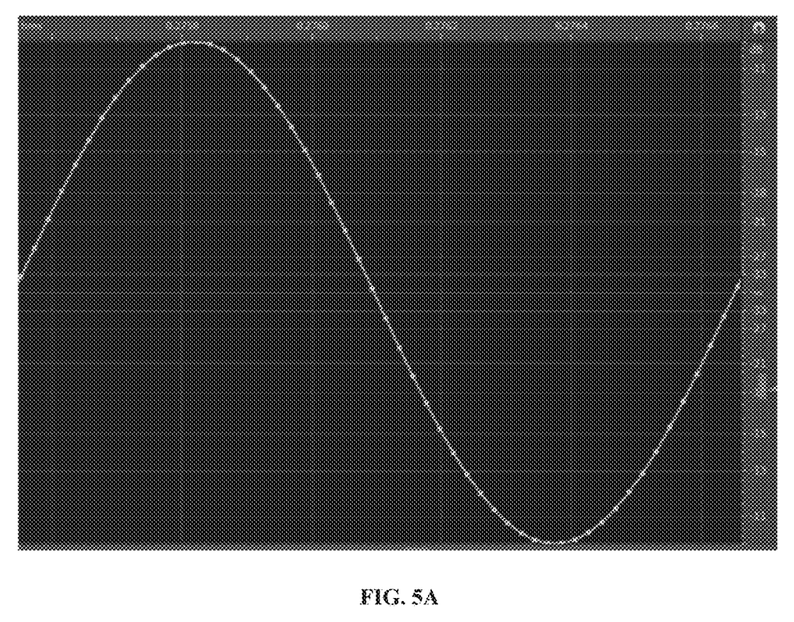
FIGS. 5A-5B illustrate time domain and spectral domain performances, respectively, of an ideal speaker, according to some embodiments.
Figure 5B:
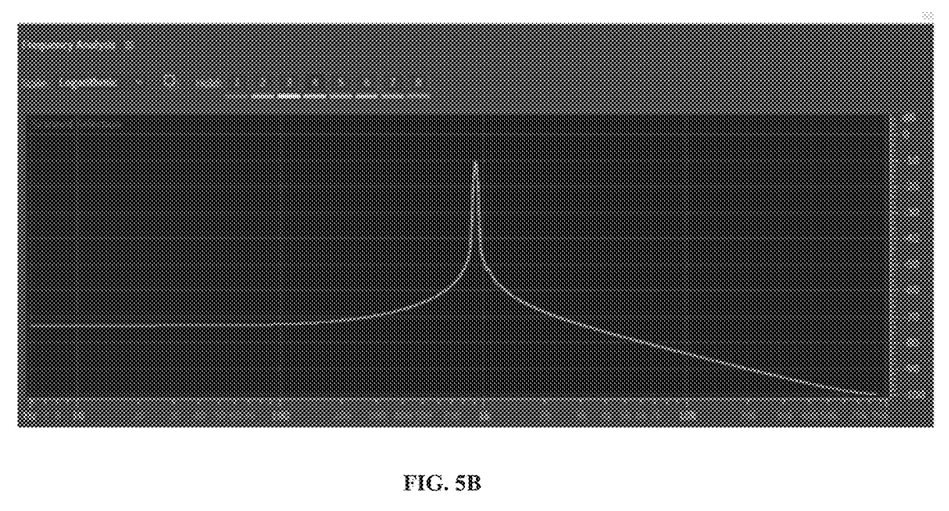

To measure and evaluate a test signal output by the DUT speaker 108, the testing device 102 may be configured to compare the test signal to a reference signal output by a reference speaker. More specifically, as illustrated in FIG. 5A, an ideal acoustic signal may be represented by a sinusoidal wave having a smooth curve in the time domain, and as illustrated in FIG. 5B, the ideal acoustic signal may have a single peak at the fundamental frequency of the acoustic signal in the spectral domain. In other words, an ideal acoustic signal is a perfect sinusoidal wave that is free of deformations in the time domain and with a single peak in the spectral domain.

Figure 6A:
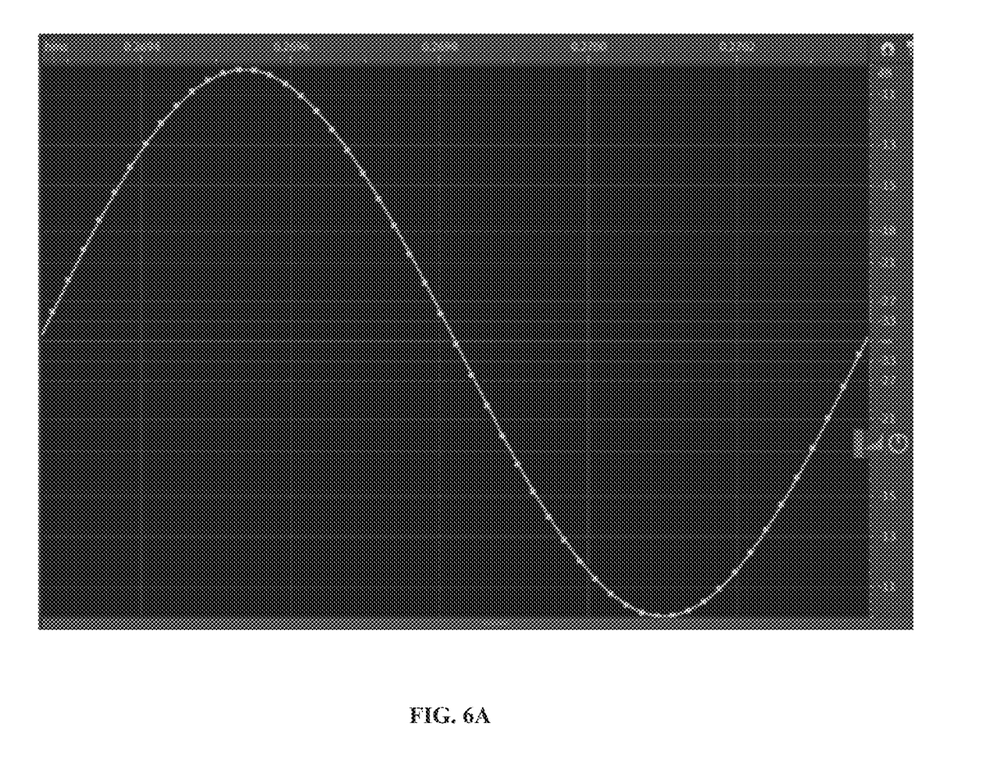
FIGS. 6A-6B illustrate time domain and spectral domain performances, respectively, of a reference speaker, according to some embodiments.
Figure 6B:
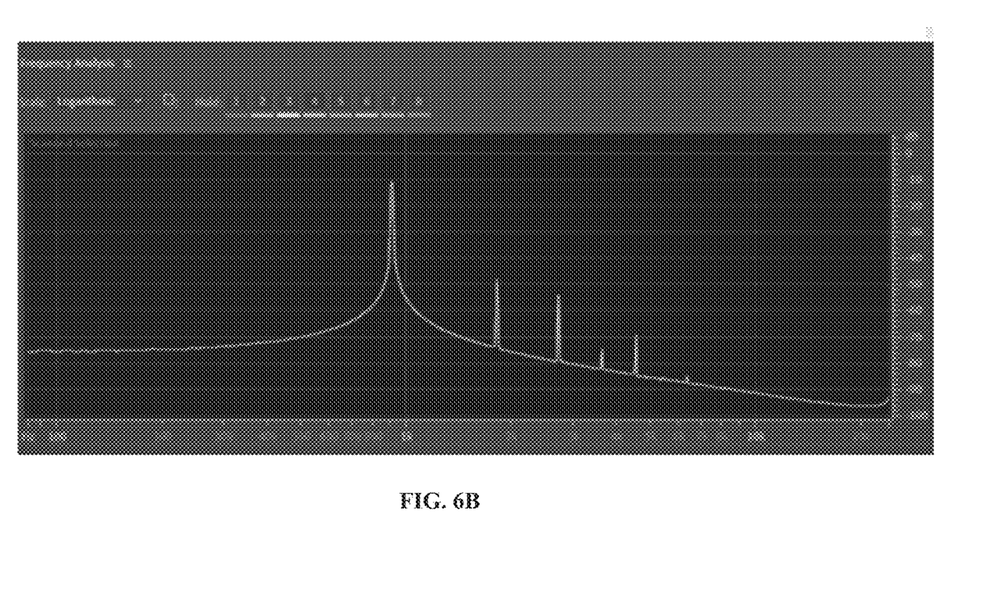
Figure 6C:
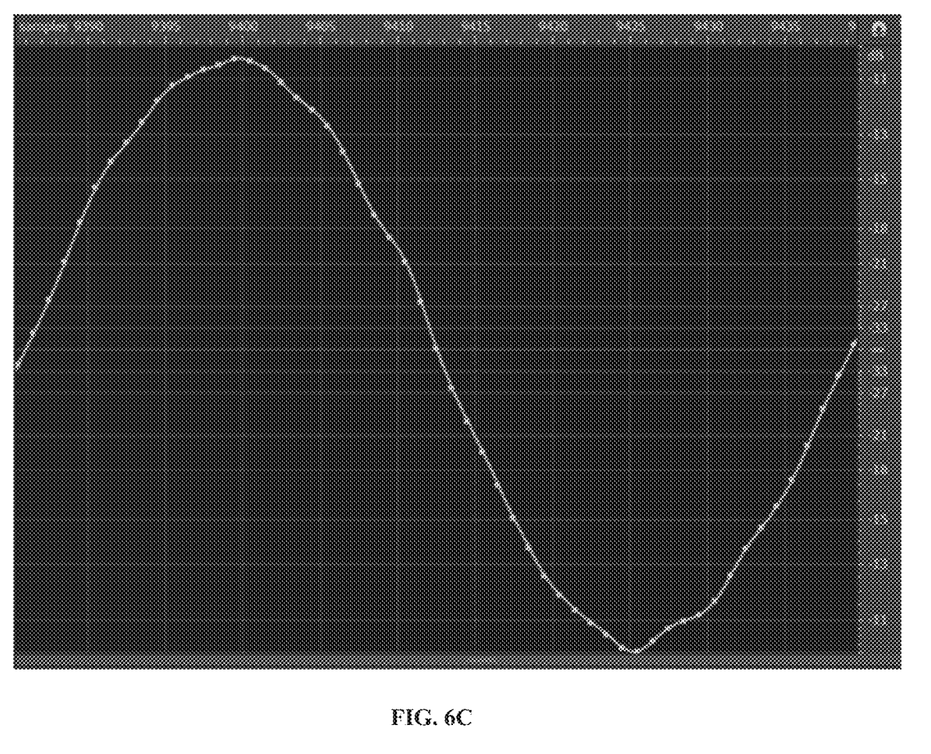
FIGS. 6C-6D illustrate time domain and spectral domain performances, respectively, of another speaker, according to some embodiments.
Figure 6D:
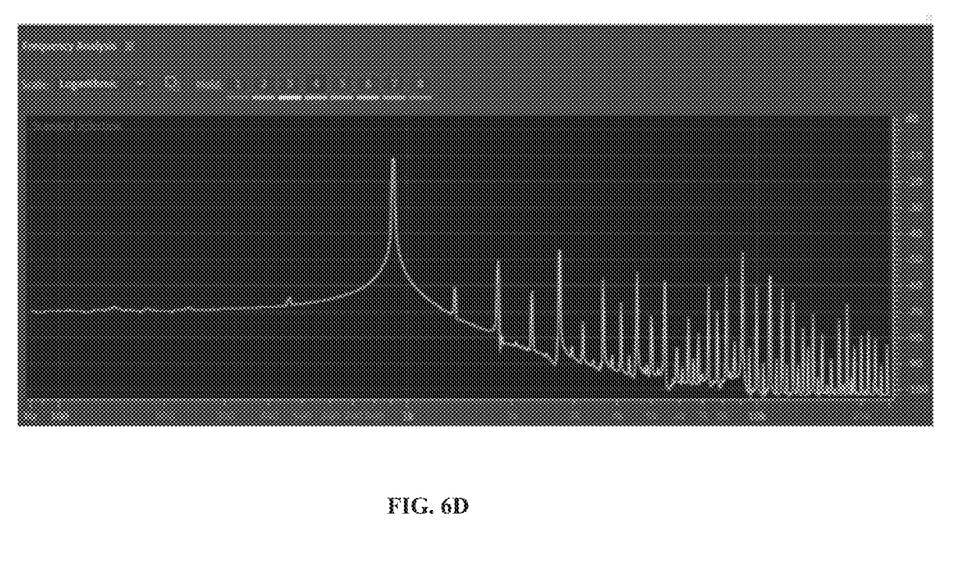

In practical implementations, acoustic signals generated by speakers have imperfect sinusoidal waves in the time domain and additional peaks at different frequencies in addition to the peak at the fundamental frequency in the spectral domain. However, some high quality speakers may generate an acoustic signal having near perfect sinusoidal waves in the time domain and a limited number of peaks at different frequencies in the spectral domain. For example, as respectively illustrated in FIGS. 6A-6B, an acoustic signal from the reference speaker may include a limited number of imperfections in the time domain and a limited number of additional peaks, e.g., five peaks, in the spectral domain. As such, the acoustic signal from the reference speaker may be used as a reference signal given its high level of performance relative to the ideal acoustic signal. In contrast to the reference speaker, as respectively illustrated in FIGS. 6C-6D, in the time domain, an acoustic signal from a poor quality speaker may have jagged curve rather a smooth curve, and in the spectral domain, the signal may have a large number of additional peaks.

In some embodiments, the testing device 102 may capture the reference signal from the reference speaker using the audio capturing device 104, slice the reference signal into a plurality of reference audio files based on a plurality of frequency bins, and store each of the plurality of reference audio files in a memory, e.g., main memory 408 or secondary memory 410 of FIG. 4. The audio files may be, for example, any uncompressed audio format, such as, but not limited to, .WAV, .AIFF, .AU or .PCM. It should be understood by those of ordinary skill in the arts that these are merely example types of audio files and that other types of audio files are further contemplated in accordance with aspects of the present disclosure. For example, the audio files may also be any format with lossless compression or lossy compression, as should be understood by those of ordinary skill in the arts. In some embodiments, the plurality of reference audio files may be a snippet, e.g., 1 second, of the reference signal.

For example, the reference speaker may playback media content having an audio component, such as, but not limited to, a movie, a television show, music, or the like, and the audio capturing device 104 may capture the audio content while placed a distance, e.g., 20 centimeters, from the reference speaker when capturing the reference signal. Once captured, the reference signal may be sliced into the plurality of reference audio files based on the plurality of frequency bins, with each reference audio file being based on one of the plurality of frequency bins. In some embodiments, the plurality of frequency bins may be between 50 Hz and 16 kHz. For example, the plurality of frequency bins may include frequency bins at 50 Hz, 100 Hz, 200 Hz, 300 Hz, 400 Hz, 500 Hz, 600 Hz, 700 Hz, 800 Hz, 900 Hz, 1000 Hz, 2000 Hz, 4000 Hz, 8000 Hz, and 16000 Hz. It should be understood by those of ordinary skill in the arts that these are merely examples of frequencies that may be used as the plurality of frequency bins and that other frequency bins are further contemplated in accordance with aspects of the present disclosure. In some embodiments, the reference signal may be generated at, for example, −10 dBFS in order to utilize a full dynamic range of the reference speaker.

In some embodiments, the reference signal may be captured at a plurality of a plurality of power output levels (i.e., sound pressure levels (SPLs)). For example, the plurality of power output levels may include a maximum power output level and a moderate power output level. The maximum power output level may be, for example, a maximum output Max_dB of the reference speaker measured in decibels. The moderate power output level may be, for example, an average of the maximum output Max_DB and a minimum output Min_dB of the reference speaker measured in decibels, i.e., (Max_DB−Min_dB)/2. In further embodiments, the moderate power output level may be the average of the maximum output Max_DB and the minimum output Min_dB plus an offset coefficient offset_DB, e.g., (Max_dB−Min_dB)/2+offset_DB. The offset coefficient may be, for example, 9 dB. In some embodiments, the reference signal may be sliced into the plurality of reference audio files at each power output level.

After the reference audio files for each power output level are stored on the memory of the testing device 102, the DUT 106 may playback the same media content as the reference speaker via the DUT speaker 108, and the audio capturing device 104 may capture an acoustic signal generated by the DUT speaker 108, i.e., a test signal. In some embodiments, the DUT speaker 108 may be tested under the same conditions as the conditions used to capture the reference signal. For example, the DUT speaker 108 may be placed at the same distance from the audio capturing device 104, e.g., 20 centimeters, as the reference speaker, and captured using the same audio capturing device 104 as that used to capture the reference signal. By testing the DUT speaker 108 under the same conditions as the reference speaker, the present disclosure ensures that the measurement and evaluation the acoustic signal generated by the DUT speaker 108 is not influenced by inconsistencies caused by an external environment. For example, placing the audio capturing device 104 at a different distance for the reference speaker and the DUT speaker 108 may affect the signal strength of one of the signals. Similarly, using a different audio capturing devices for capturing each of the signals may introduce differences between the two signals caused by the quality of the audio capturing devices, rather than the speakers themselves.

Like the reference signal, the test signal may be sliced into a plurality of test audio files based on the plurality of frequency bins, with each test audio file being based on one of the plurality of frequency bins. In some embodiments, the plurality of frequency bins may be between 50 Hz and 16 kHz. For example, the plurality of frequency bins may include frequency bins at 50 Hz, 100 Hz, 200 Hz, 300 Hz, 400 Hz, 500 Hz, 600 Hz, 700 Hz, 800 Hz, 900 Hz, 1000 Hz, 2000 Hz, 4000 Hz, 8000 Hz, and 16000 Hz. It should be understood by those of ordinary skill in the arts that these are merely examples of frequencies that may be used as the plurality of frequency bins and that other frequency bins are further contemplated in accordance with aspects of the present disclosure. In some embodiments, the test signal may be generated at, for example, −10 dBFS in order to utilize a full dynamic range of the DUT speaker 108. In some embodiments, the plurality of test audio files may be a snippet, e.g., 1 second, of the test signal.

In some embodiments, the test signal may be captured at the plurality of power output levels (i.e., sound pressure levels (SPLs)). For example, the plurality of power output levels may include a maximum power output level and a moderate power output level. The maximum power output level may be, for example, a maximum output Max_dB of the DUT speaker 108 measured in decibels. The moderate power output level may be, for example, an average of the maximum output Max_DB and a minimum output Min_dB of the DUT speaker 108 measured in decibels, i.e., (Max_DB−Min_dB)/2. In further embodiments, the moderate power output level may be the average of the maximum output Max_DB and the minimum output Min_dB plus an offset coefficient offset_DB, e.g., (Max_dB−Min_dB)/2+ offset_DB. The offset coefficient may be, for example, 9 dB. In some embodiments, the test signal may be sliced into the plurality of test audio files at each power output level.

The testing device 102 may then compare each test signal to the reference signal at each power output level. For example, the comparison may include comparing a test audio file to a corresponding one of the reference audio files at each power output level. For example, for each power output level, the test audio file at the 50 Hz frequency bin may be compared to the reference audio file at the 50 Hz frequency bin, the test audio file at the 100 Hz frequency bin may be compared to the reference audio file at the 100 Hz frequency bin, the test audio file at the 200 Hz frequency bin may be compared to the reference audio file at the 200 Hz frequency bin, and so on and so forth. That is, two sets of files are compared to another—1) at the maximum power output level, the test audio files are compared to the reference audio files and 2) at the moderate power output level, the test audio files are compared to the reference audio files.

In some embodiments, the comparison may include calculating a distance between the test signal and the reference signal at each frequency bin. This may be achieved using an open source library to calculate a mel-frequency cepstral coefficient (MFCC) difference metric, e.g., a spectral difference, as should be understood by those of ordinary skill in the art. For example, the MFCC difference may be based on a plurality of vectors determined from the comparison of the test signal and the reference signal. The MFCC difference metric may be implemented using any programming language, procedural, functional, or object-oriented. Non-limiting examples include C, C++, C#, Objective-C, Java, Swift, Go, Ruby, Perl, Python, JavaScript, WebAssembly, or virtually any other language, with any other libraries or schemas, in any kind of framework, runtime environment, virtual machine, interpreter, stack, engine, or similar mechanism, including but not limited to Node.js, V8, Knockout, jQuery, Dojo, Dijit, OpenUI5, AngularJS, Express.js, Backbone.js, Ember.js, DHTMLX, Vue, React, Electron, and so on, among many other non-limiting examples.

In some embodiments, the distance between the test signal and the reference signal may be used to grade the DUT speaker 108. In this way, the testing device 102 may generate a performance score of the DUT speaker 108 at each frequency bin for each of the plurality of power output levels. The performance score may be a measure of a difference in a total harmonic distortion between the reference signal and the test signal for each frequency bin. For example, the distance between the test signal and the reference signal may be measured on a scale from 0-300, with 0 indicating no distance between the signals and 300 indicating a significant distance between the signals.

The distance may be compared to a plurality of threshold values to grade the DUT speaker 108. For example, when the distance is greater than a first threshold value, the DUT speaker 108 may be given a first grade at the given frequency bin. In some embodiments, the DUT 106 may be adjusted using a digital signal processing (DSP), as should be understood by those of ordinary skill in the art. As another example, when the distance is less than the first threshold value and greater than a second threshold value, the DUT speaker 108 may be given a second grade at the given frequency bin. Even further, when the distance is less than the second threshold value, the DUT speaker 108 may be given a third grade at the given frequency bin. In some embodiments, the first grade may be a failing grade, thereby indicating that the DUT 106 needs to be adjusted at such frequency. In contrast, the second and third grades may be passing grades. In some embodiments, an overall score for determining whether the DUT speaker 108 passes may be based on an average of the distances at each frequency bin of the plurality of frequency bins. The overall score may likewise be compared to the aforementioned thresholds and the DUT speaker 108 may be graded in the same manner.

In some embodiments, the DUT speaker 108 may be tested on a channel-by-channel basis. For example, for a stereo speaker, the processes described herein may be performed with respect to the both the left and right channels.

Figure 7:
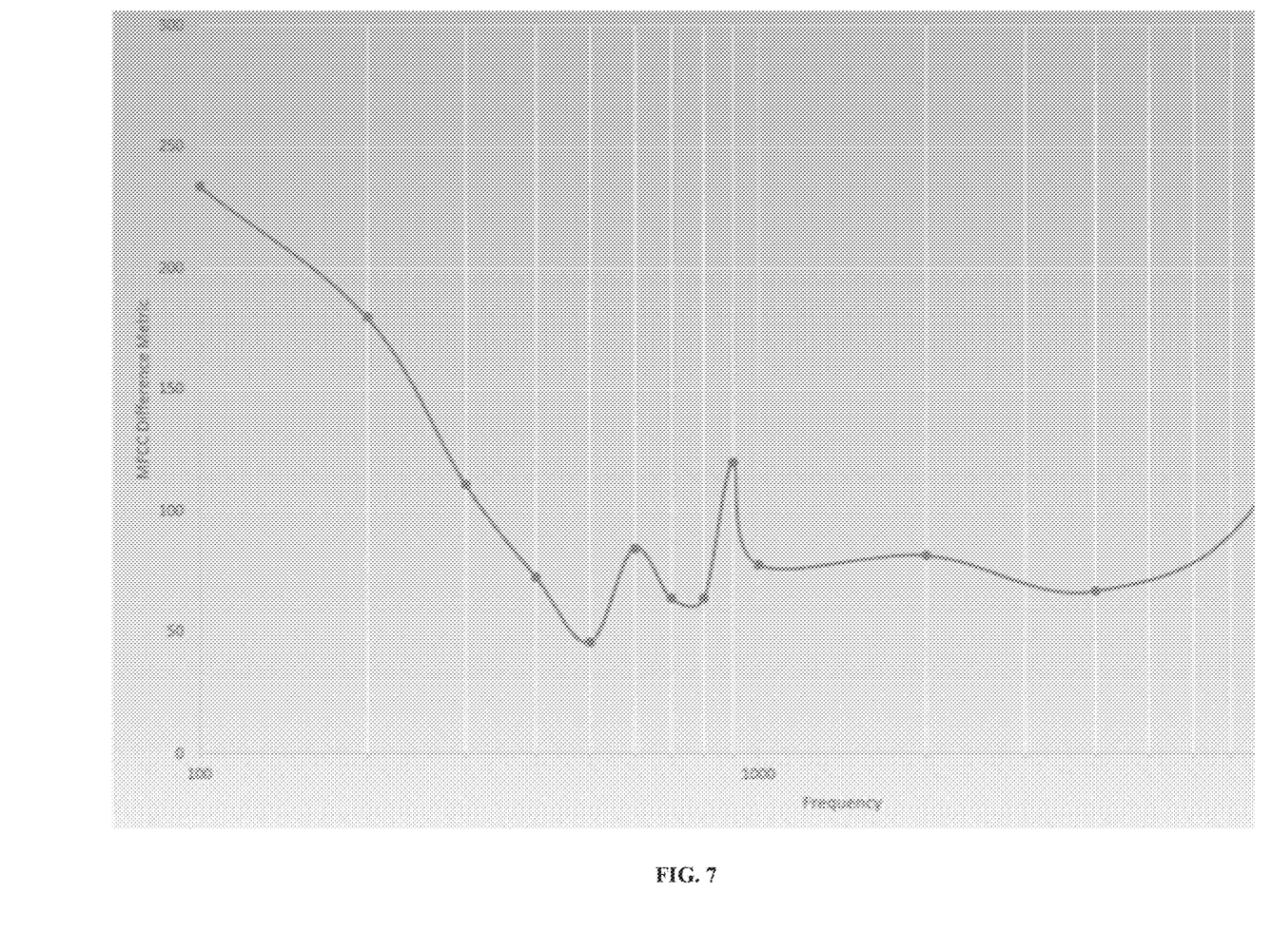
FIGS. 7-9 illustrate performance graphs of a device under test (DUT), according to some embodiments.
Figure 8:
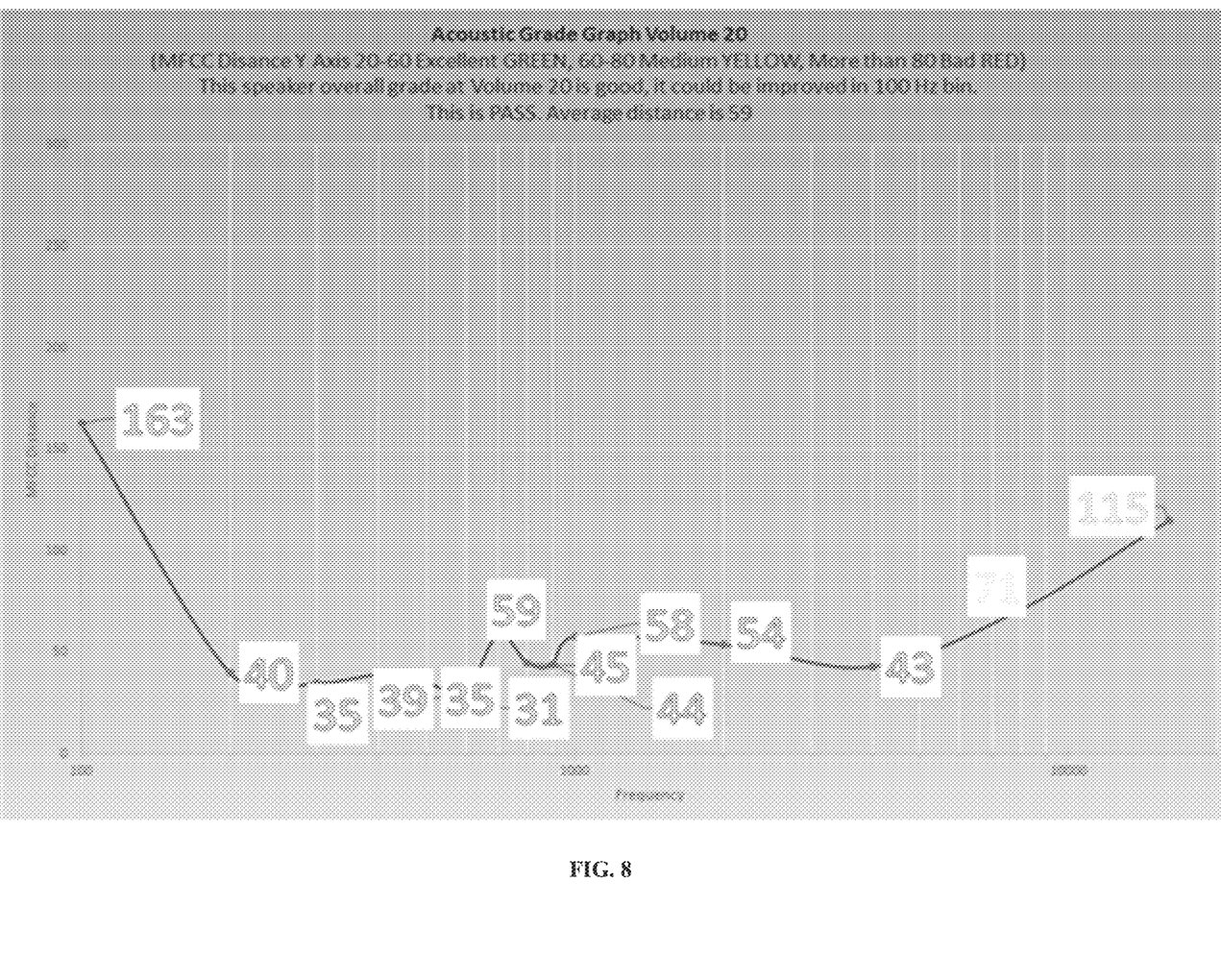
Figure 9:
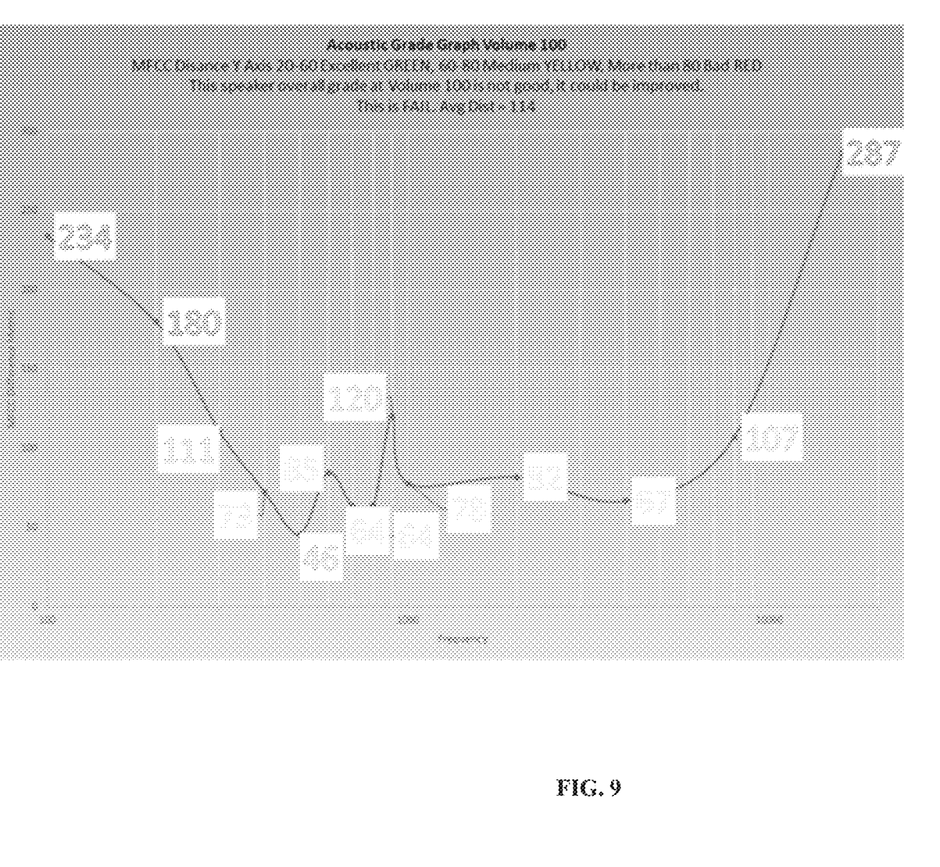

The testing device 102 may generate a report indicating the performance score. For example, as illustrated in FIG. 7, the report may include a performance graph of the test signal at each frequency bin. As another example illustrated in FIGS. 8 and 9, the performance graph may also include distance between the test signal and the reference signal at each frequency bin. In some embodiments, the distance illustrated on the performance graph may be colored to indicate whether the performance score received a first, second, or third grade. For example, the first grade may be colored red, the second grade may be colored yellow, and the third grade may be colored green. As further illustrated in FIGS. 8 and 9, the report may include a summary portion indicating the overall performance of the DUT speaker 108. For example, the summary portion may indicate the power output level of the DUT speaker 108, whether the DUT speaker 108 passed (see, e.g., FIG. 8) or failed (see, e.g., FIG. 9), an average distance, and any frequencies at which the performance of the DUT speaker 108 may be improved, e.g., 100 Hz bin as shown in FIG. 8.

Figure 2:
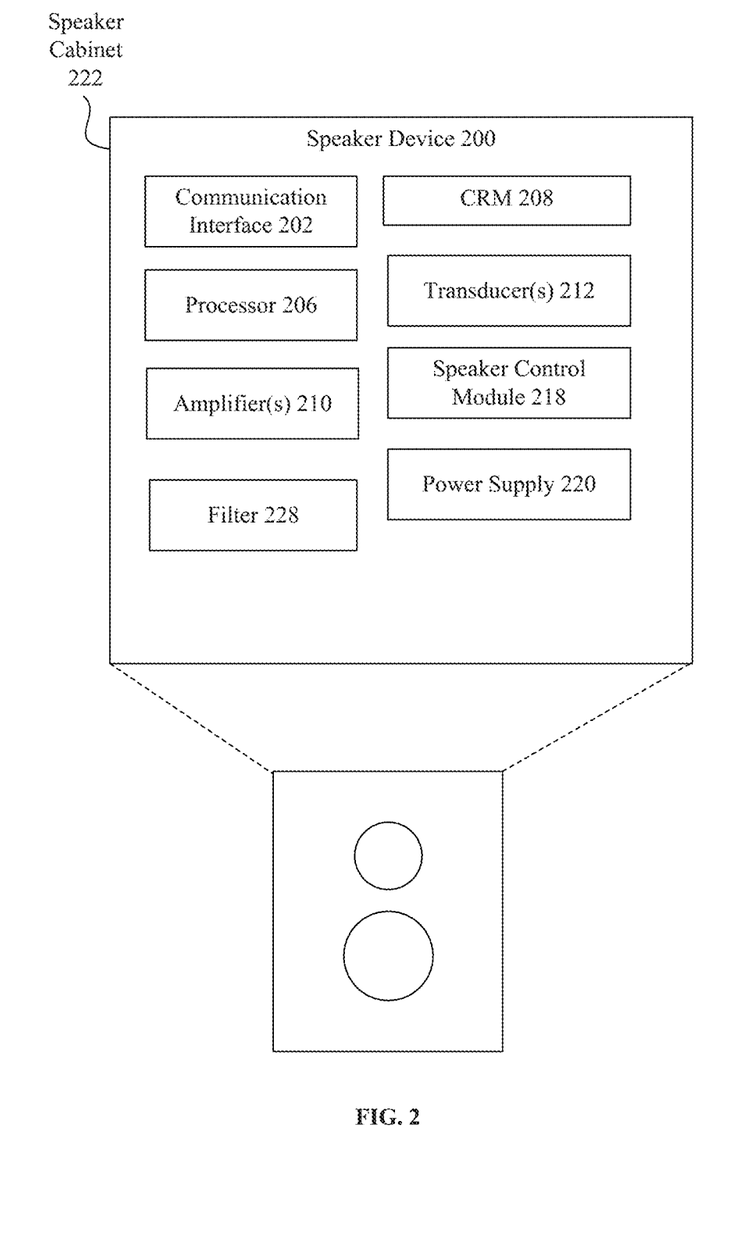
FIG. 2 illustrates a speaker, according to some embodiments.

FIG. 2 is a block diagram of an example embodiment of a speaker 200, e.g., the speaker 108 of FIG. 1. The speaker 200 may comprise a processor 206, a non-transitory, tangible computer readable memory (CRM) 208, one or more amplifiers 210, a speaker control module 218 for receiving user commands via one or more controls (e.g., buttons and/or a remote control interface), a power supply 220, or more filters 228 (e.g., the filters 120), transducers 212, and a speaker cabinet 222 to enclose components of the speaker 200.

The communication interface(s) 202 may include one or more interfaces and hardware components for enabling communication with various other devices. For example, communication interface(s) 202 facilitate communication through one or more of the Internet, cellular networks, and wireless networks (e.g., Wi-Fi, cellular). The non-transitory, tangible computer readable memory (CRM) 208 may be used to store any number of functional components that are executable by the processor 206. In many implementations, these functional components comprise instructions or programs that are executable by the processors and that, when executed, specifically configure the one or more processors 206 to perform the actions attributed above to the speakers (e.g., the speaker 108). In addition, the non-transitory, tangible computer readable memory 208 stores data used for performing the operations described herein.

The processor 206 may select which portion of the content will be processed. In some embodiments, in a stereo mode, for example, the speaker 200 processes either the left stereophonic channel or right stereophonic channel. In a surround sound mode, the speaker 200 selects a signal to process from among the multiple channels. The selection of the playback mode (e.g., stereo mode, mono mode, surround sound mode) may be performed via the speaker control module 218. In some embodiments, the filters 228 modify the content to determine the frequencies of the content that are reproduced by the speaker 200 in accordance with the filter settings 232. This may be done by performing cross-over, phase matching, and time alignment filtering function in a digital implementation. In some examples, the filters 228 may include FIR or IIR filters that implement a crossover filtering technique.

The output of the processor 206 may be a set of filtered digital audio signals, one for each of the transducers 212. These signals may be directed to the inputs of digital amplifiers, which generate high power output signals that drive the speaker transducers 212 to produce an optimal and/or improved reproduction of the content in concert with one or more other speakers having different performance capabilities in accordance with the present invention.

Figure 3:
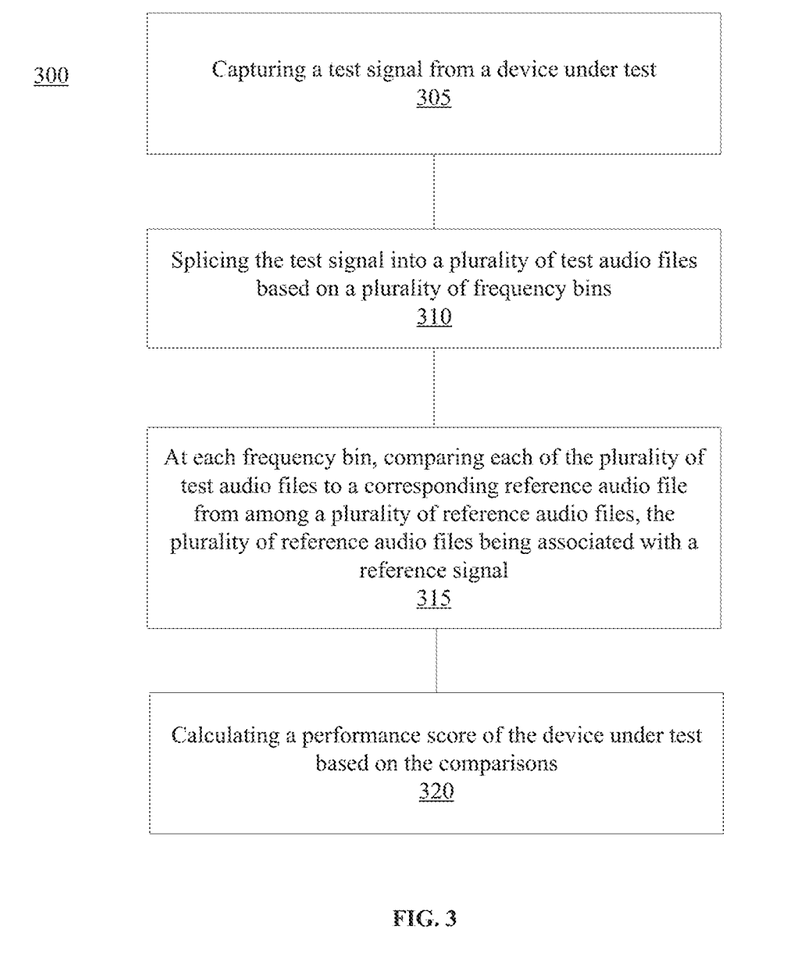
FIG. 3 illustrates a flowchart for measuring and evaluating a signal generated by a device under test (DUT), according to some embodiments.

FIG. 3 illustrates an example method for measuring and evaluating a signal generated by a device under test (DUT).

For example, at 305, a testing device (e.g., testing device 102 of FIG. 1) may capture a test signal from the DUT (e.g., DUT 106 of FIG. 1).

At 310, the testing device (e.g., testing device 102 of FIG. 1) may slice the test signal into a plurality of test audio files based on a plurality of frequency bins.

At 315, at each frequency bin, the testing device (e.g., testing device 102 of FIG. 1) may compare each of the plurality of test audio files to a corresponding reference audio file from among a plurality of reference audio files. The plurality of reference audio files may be associated with a reference signal.

At 320, the testing device (e.g., testing device 102 of FIG. 1) may calculate a performance score of the device under test based on the comparisons.

Example Computer System

Various embodiments can be implemented, for example, using one or more well-known computer systems, such as computer system 400 shown in FIG. 4. Computer system 400 can be any well-known computer capable of performing the functions described herein, such as computers available from International Business Machines, Apple, Sun, HP, Dell, Sony, Toshiba, etc.

Computer system 400 includes one or more processors (also called central processing units, or CPUs), such as a processor 404. Processor 404 is connected to a communication infrastructure or bus 402.

Computer system 400 also includes user input/output device(s) 432, such as monitors, keyboards, pointing devices, etc., which communicate with communication infrastructure 402 through user input/output interface(s) 430.

Computer system 400 also includes a main or primary memory 408, such as random access memory (RAM). Main memory 408 may include one or more levels of cache. Main memory 408 has stored therein control logic (i.e., computer software) and/or data.

Computer system 400 may also include one or more secondary storage devices or memory 410. Secondary memory 410 may include, for example, a hard disk drive 412 and/or a removable storage device or drive 414. Removable storage drive 414 may be a floppy disk drive, a magnetic tape drive, a compact disk drive, an optical storage device, tape backup device, and/or any other storage device/drive.

Removable storage drive 414 and interface 420 may interact with a removable storage units 416, 418, respectively. Removable storage units 416, 418 includes a computer usable or readable storage device having stored thereon computer software (control logic) and/or data. Removable storage units 416, 418 may be a floppy disk, magnetic tape, compact disk, DVD, optical storage disk, and/ any other computer data storage device. Removable storage drive 414 reads from and/or writes to removable storage unit 416 in a well-known manner.

According to an exemplary embodiment, secondary memory 410 may include other means, instrumentalities or other approaches for allowing computer programs and/or other instructions and/or data to be accessed by computer system 400. Such means, instrumentalities or other approaches may include, for example, a removable storage drive 414 and an interface 420. Examples of the removable storage drive 414 and the interface 420 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 400 may further include a communication or network interface 424. Communication interface 424 enables computer system 400 to communicate and interact with any combination of remote devices, remote networks, remote entities, etc. (individually and collectively referenced by reference number 428). For example, communication interface 424 may allow computer system 400 to communicate with remote devices 428 over communications path 426, which may be wired and/or wireless, and which may include any combination of LANs, WANs, the Internet, etc. Control logic and/or data may be transmitted to and from computer system 400 via communication path 426.

In an embodiment, a tangible apparatus or article of manufacture comprising a tangible computer useable or readable medium having control logic (software) stored thereon is also referred to herein as a computer program product or program storage device. This includes, but is not limited to, computer system 400, main memory 408, secondary memory 410, and removable storage units 416, 418, as well as tangible articles of manufacture embodying any combination of the foregoing. Such control logic, when executed by one or more data processing devices (such as computer system 400), causes such data processing devices to operate as described herein.

Based on the teachings contained in this disclosure, it will be apparent to persons skilled in the relevant art(s) how to make and use embodiments of this disclosure using data processing devices, computer systems and/or computer architectures other than that shown in FIG. 4. In particular, embodiments can operate with software, hardware, and/or operating system implementations other than those described herein.

It is to be appreciated that the Detailed Description section, and not any other section, is intended to be used to interpret the claims. Other sections can set forth one or more but not all exemplary embodiments as contemplated by the inventor(s), and thus, are not intended to limit this disclosure or the appended claims in any way.

While this disclosure describes exemplary embodiments for exemplary fields and applications, it should be understood that the disclosure is not limited thereto. Other embodiments and modifications thereto are possible, and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments can perform functional blocks, steps, operations, methods, etc. using orderings different than those described herein.

References herein to "one embodiment," "an embodiment," "an example embodiment," or similar phrases, indicate that the embodiment described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments can be described using the expression "coupled" and "connected" along with their derivatives. These terms are not necessarily intended as synonyms for each other. For example, some embodiments can be described using the terms "connected" and/or "coupled" to indicate that two or more elements are in direct physical or electrical contact with each other. The term "coupled," however, can also mean that two or more elements are not in direct contact with each other, but yet still co-operate or interact with each other.

The breadth and scope of this disclosure should not be limited by any of the above-described exemplary embodiments, but should be defined only in accordance with the following claims and their equivalents.

What is claimed is:

1. A method, comprising:
   capturing a test signal from a device under test (DUT);
   splicing the test signal into a plurality of test audio files based on a plurality of frequency bins;
   at each frequency bin, comparing each of the plurality of test audio files to a corresponding reference audio file from among a plurality of reference audio files to determine a spectral distance between each of the plurality of test audio files and the corresponding reference audio file, the plurality of reference audio files being associated with a reference signal;
   comparing the spectral distances to respective threshold values; and
   calculating a performance score of the DUT based on the comparisons.

2. The method of claim 1, wherein the calculating comprises calculating the performance score based on an average of the spectral distances between the test signal and the reference signal.

3. The method of claim 1, further comprising generating a report indicating the performance score.

4. The method of claim 3, wherein the report comprises a performance graph.

5. The method of claim 4, wherein the performance graph illustrates the performance score of the test signal at each of the plurality of frequency bins.

6. The method of claim 1, wherein the plurality of frequency bins comprises frequencies between 50 Hz and 16 kHz.

7. The method of claim 1, wherein the DUT comprises a speaker.

8. A non-transitory, tangible computer-readable medium having instructions stored thereon that, when executed by at least one computing device, cause the at least one computing device to perform operations comprising:
- capturing a test signal from a device under test (DUT);
- splicing the test signal into a plurality of test audio files based on a plurality of frequency bins;
- at each frequency bin, comparing each of the plurality of test audio files to a corresponding reference audio file from among a plurality of reference audio files to determine a spectral distance between each of the plurality of test audio files and the corresponding reference audio file, the plurality of reference audio files being associated with a reference signal;
- comparing the spectral distances to respective threshold values; and
- calculating a performance score of the DUT based on the comparisons.

9. The medium of claim 8, wherein the calculating comprises calculating the performance score based on an average of the spectral distances between the test signal and the reference signal.

10. The medium of claim 8, further comprising generating a report indicating the performance score.

11. The medium of claim 10, wherein the report comprises a performance graph.

12. The medium of claim 11, wherein the performance graph illustrates the performance score of the test signal at each of the plurality of frequency bins.

13. The medium of claim 8, wherein the plurality of frequency bins comprises frequencies between 50 Hz and 16 kHz.

14. The medium of claim 8, wherein the DUT comprises a speaker.

15. A device comprising:
- a memory storing instructions for measuring and evaluating a signal generated by a device under test (DUT); and
- a processor configured to execute the instructions, the instructions causing the processor to perform operations comprising:
  - capturing a test signal from the DUT;
  - slicing the test signal into a plurality of test audio files based on a plurality of frequency bins;
  - at each frequency bin, comparing each of the plurality of test audio files to a corresponding reference audio file from among a plurality of reference audio files to determine a spectral distance between each of the plurality of test audio files and the corresponding reference audio file, the plurality of reference audio files being associated with a reference signal;
  - comparing the spectral distances to respective threshold values; and
  - calculating a performance score of the DUT based on the comparisons.

16. The device of claim 15, wherein the calculating comprises calculating the performance score based on an average of the spectral distances between the test signal and the reference signal.

17. The device of claim 15, the operations further comprising generating a report indicating the performance score, wherein the report comprises a performance graph.

18. The device of claim 17, wherein the performance graph illustrates the performance score of the test signal at each of the plurality of frequency bins.

19. The device of claim 15, wherein the plurality of frequency bins comprises frequencies between 50 Hz and 16 kHz.

20. The device of claim 15, wherein the DUT comprises a speaker.

* * * * *